United States Patent
Zhang et al.

(10) Patent No.: US 11,837,476 B2
(45) Date of Patent: Dec. 5, 2023

(54) FLIP-CHIP PACKAGE WITH REDUCED UNDERFILL AREA

(71) Applicant: WESTERN DIGITAL TECHNOLOGIES, INC., San Jose, CA (US)

(72) Inventors: Yazhou Zhang, Shanghai (CN); Hope Chiu, Shanghai (CN); Jiandi Du, Shanghai (CN); Paul Qu, Shanghai (CN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 3 days.

(21) Appl. No.: 16/874,751

(22) Filed: May 15, 2020

(65) Prior Publication Data
US 2021/0335628 A1   Oct. 28, 2021

(51) Int. Cl.
*H01L 21/56* (2006.01)
*H01L 23/00* (2006.01)
*H01L 21/48* (2006.01)
*H01L 23/24* (2006.01)

(52) U.S. Cl.
CPC ........ *H01L 21/563* (2013.01); *H01L 21/4803* (2013.01); *H01L 23/24* (2013.01); *H01L 24/32* (2013.01); *H01L 2224/3224* (2013.01); *H01L 2224/73104* (2013.01)

(58) Field of Classification Search
CPC .............................. H01L 21/563; H01L 23/31
See application file for complete search history.

(56) References Cited

U.S. PATENT DOCUMENTS

| | | | | |
|---|---|---|---|---|
| 5,128,746 | A * | 7/1992 | Pennisi | B23K 35/3613 257/793 |
| 6,058,021 | A * | 5/2000 | Yamamoto | H01L 24/29 29/841 |
| 6,462,284 | B1 * | 10/2002 | Hashimoto | H01L 23/552 257/737 |
| 6,821,878 | B2 * | 11/2004 | Danvir | H01L 24/16 257/E21.511 |
| 7,359,211 | B2 * | 4/2008 | Landeros | B23K 3/0623 361/783 |

(Continued)

FOREIGN PATENT DOCUMENTS

WO   WO-2013101668 A1 *   7/2013   .......... H01L 21/563

OTHER PUBLICATIONS

Zhuqing Zhang and C.P. Wong. "Recent Advances in Flip-Chip Underfill: Materials, Process, and Reliability," IEEE Transactions on Advanced Packaging, vol. 27, No. 3, Aug. 2004, 515-524.

*Primary Examiner* — Dale E Page
*Assistant Examiner* — Abbigale A Boyle
(74) *Attorney, Agent, or Firm* — MORGAN, LEWIS & BOCKIUS LLP

(57) ABSTRACT

A flip-chip package and a method for assembling a flip-chip package includes positioning the die on a substrate and introducing an underfill material into a space between the die and the substrate, where a portion of the underfill material extends beyond an edge of the die and forms a fillet that at least partially surrounds the die. The underfill material is cured, and a portion of the fillet is removed to reduce the area of the fillet.

9 Claims, 5 Drawing Sheets

(56) References Cited

U.S. PATENT DOCUMENTS

| | | | |
|---|---|---|---|
| 8,982,577 B1 * | 3/2015 | Fuentes | H01L 23/13 361/783 |
| 9,368,480 B2 * | 6/2016 | Murai | H01L 21/563 |
| 9,768,145 B2 * | 9/2017 | Yu | H01L 24/03 |
| 10,249,515 B2 * | 4/2019 | Yao | H01L 21/565 |
| 10,796,976 B2 * | 10/2020 | Pan | H01L 21/568 |
| 11,121,051 B2 * | 9/2021 | Cheng | H01L 21/56 |
| 2002/0060084 A1 | 5/2002 | Hilton et al. | |
| 2021/0057477 A1 * | 2/2021 | Takagi | H01L 27/14636 |
| 2021/0118758 A1 * | 4/2021 | Cheng | H01L 24/32 |

\* cited by examiner

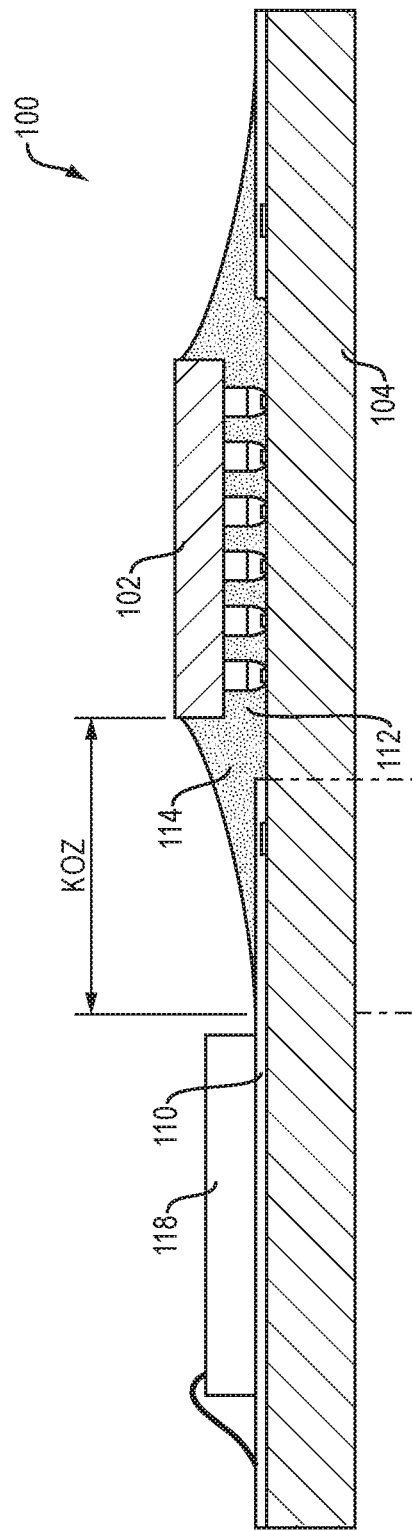
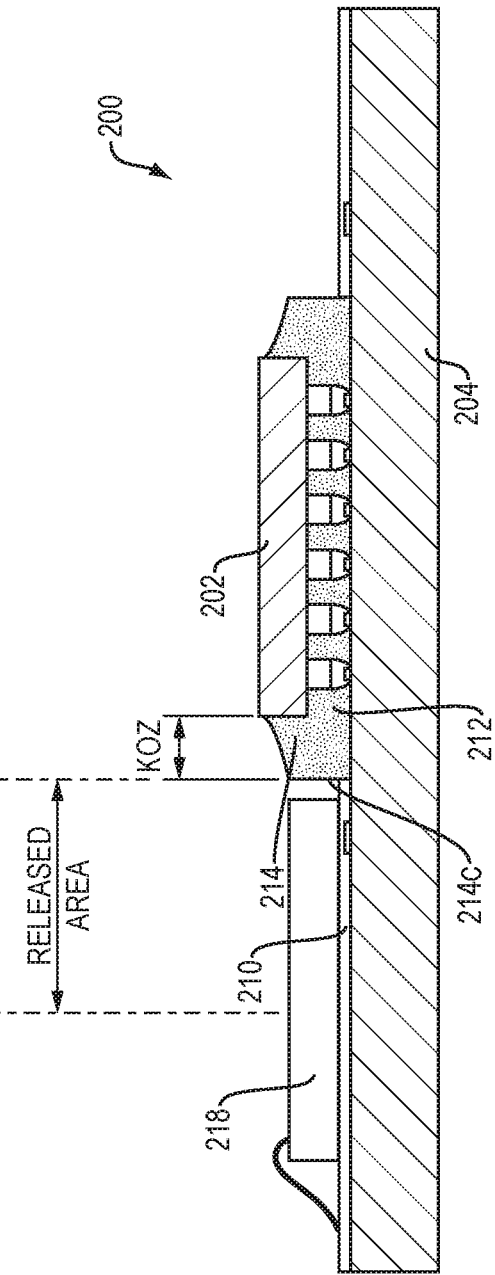
FIG. 4A
FIG. 4B

FLIP-CHIP PACKAGE WITH REDUCED UNDERFILL AREA

CROSS-REFERENCE TO RELATED APPLICATIONS

This application claims priority to Chinese Patent Application No. CN 202010348518.X, filed on Apr. 28, 2020, which is incorporated herein by reference in its entirety.

BACKGROUND

The present disclosure relates to packaging for integrated circuit (IC) dies, particularly flip-chip packaging. In some embodiments, the present disclosure includes methods for reducing the underfill area surrounding a flip-chip die.

Integrated circuit (IC) dies can be packaged according to different methods. For example, in a conventional wire-bond package, a die is mounted upright on a substrate having external circuitry, e.g., a printed circuit board (PCB), and wires are used to interconnect bonding pads on the die to the external circuitry of the substrate. In a flip-chip package, solder bumps are deposited on the die bonding pads on the top side of the die. To connect the die to the external circuitry of the substrate, the die is "flipped" such that its top side faces downward toward the substrate and positioned such that the solder bumps are aligned with matching pads on the substrate. Solder reflow is performed to connect the solder bumps with the substrate pads.

A mismatch in the coefficients of thermal expansion of the die and the substrate can create stresses at the solder joints between the die and the substrate, which in turn can cause fatigue and breakage in the connections between the die and the substrate. In order to strengthen the attachment of the die and the substrate, an underfill material may be applied between the die and the substrate to improve adhesion and/or distribute thermal stresses. The underfill material may include, for example, a resin (e.g., epoxy resin) that is applied as a flowable liquid between the die and the substrate and then hardened (e.g., by a curing process). The underfill material, for example, may be injected into the space between the die and the substrate from one or more sides of the die.

Due to the flowable nature of the underfill material, typically a portion of the underfill material flows beyond the edges of the die onto the surrounding substrate. When hardened or cured, this excess underfill material forms a fillet around the die such that the footprint of the underfill material on the substrate typically exceeds the footprint of the die itself. The area of the substrate occupied by the underfill fillet is typically unavailable for the placement of additional dies or other components and may be referred to herein as a "keep-out-zone" or "KOZ." It would be advantageous to be able to reduce the size of the KOZ.

SUMMARY

The present disclosure, according to some embodiments, provides a flip-chip package having a reduced underfill area. In some such embodiments, having a reduced underfill area provides a greater area on a substrate that is available for other components (e.g., NAND dies or other Flash memory chips) such that more components can be connected to a given substrate. The reduced underfill area may also allow other dies to be located closer to the flip-chip die. This ability can be particularly advantageous, for example, in order to enlarge package capacity or to reduce package size.

In some embodiments, a flip-chip package in accordance with the present disclosure has a portion of the underfill fillet surrounding an IC die removed in order to reduce the area on the substrate occupied by the fillet (KOZ). In some embodiments, the underfill fillet is truncated (e.g., laser cut) after the underfill material is hardened or cured, and a portion of the underfill fillet is removed in order to reclaim an area on the substrate for the placement of other components (e.g., NAND dies or other chips). In some embodiments, the underfill fillet is truncated at or proximate to an edge of a solder mask of the substrate. In yet further embodiments, a release film is applied to the substrate and a portion of the fillet is formed on the release film. In some embodiments, the underfill fillet is truncated at or proximate to an edge of the release film, and the release film is removed from the substrate, thereby removing the portion of the fillet remaining on release film.

In some embodiments, a method for packaging an IC die includes positioning the die on a surface of a substrate, introducing an underfill material into a space between the die and the substrate, with a portion of the underfill material extending beyond an edge of the die, curing the underfill material, wherein the portion of the underfill material that extends beyond the edge of the die forms a fillet at least partially surrounding the die, and removing a section of the fillet. In some embodiments, the method further includes applying a release film on the substrate prior to introducing and/or curing the underfill material, wherein the fillet at least partially overlays a portion of the release film. In some embodiments, the substrate comprises a solder mask, and the release film is applied over the solder mask.

In further embodiments, the method includes cutting the fillet. In some such embodiments, cutting the fillet includes laser cutting the fillet at or proximate to an edge of the release film. In yet further embodiments, cutting the fillet includes partitioning the fillet into at least a first portion and a second portion, wherein the first portion of the fillet overlays the portion of the release film and the second portion of the fillet is adjacent to the IC die. In some embodiments, removing the section of the fillet includes removing the release film from the substrate together with the first portion of the fillet. In some embodiments, removing the section of the fillet reduces an area of the underfill material by, for example, at least 30%, at least 40%, or at least 50%. In some embodiments, the second portion of the fillet comprises a truncated surface that is planar or substantially planar. The truncated surface may be perpendicular to the surface of the substrate according to some embodiments. In other embodiments, the truncated surface may be oblique to the surface of the substrate.

In some embodiments, a method according to the present disclosure includes positioning at least one additional component (e.g., a NAND die or other memory chip) on the substrate adjacent to the IC die. In some such embodiments, the at least one additional component is positioned at least partially on an area of the substrate where the section of the fillet was removed.

In further embodiments, the present disclosure provides an IC die package that is assembled using the methods described herein. In some embodiments, the IC die package includes a substrate, an IC die (e.g., a flip-chip die or "FC die") positioned on a surface of the substrate, and an underfill material at least partially disposed between the IC die and the surface of the substrate, with a portion of the underfill material extending beyond an edge of the IC die forming a fillet at least partially surrounding the IC die, wherein the fillet includes a truncation. In some embodiments, the substrate includes a solder mask, and the fillet includes a truncated surface at or proximate to an edge of the solder mask. In some embodiments, the truncated surface is substantially perpendicular to the surface of the substrate.

In some embodiments, the IC die package includes at least one NAND die positioned on the solder mask. In some embodiments, at least one NAND die is positioned proximate to or adjacent to the truncated surface of the fillet. In yet further embodiments, the at least one NAND die is positioned less than 1000 μm from the IC die.

BRIEF DESCRIPTION OF THE DRAWINGS

The foregoing summary, as well as the following detailed description, will be better understood when read in conjunction with the appended drawings. For the purpose of illustrating the invention, there are shown in the drawings embodiments that are presently preferred, wherein like reference numerals indicate like elements throughout. It should be understood, however, that the invention can be embodied in different forms and thus should not be construed as being limited to the illustrated embodiments set forth herein. It should also be appreciated that the appended drawings may not be drawn to scale.

FIGS. 4A and 4B are diagrams comparing the relative placement of an additional component (e.g., NAND die) on a typical flip-chip package (FIG. 4A) and a flip-chip package in accordance with an embodiment of the present invention having a reduced underfill area (FIG. 4B).

DETAILED DESCRIPTION

The present subject matter will now be described more fully hereinafter with reference to the accompanying Figures, in which representative embodiments are shown. The present subject matter can, however, be embodied in different forms and should not be construed as limited to the specific embodiments set forth herein. Rather, these embodiments are provided to describe and enable one of skill in the art. Also, the elements illustrated in the accompanying Figures are not necessarily drawn to scale, but rather, may have been exaggerated to highlight the important features of the subject matter therein.

Figure 1A:
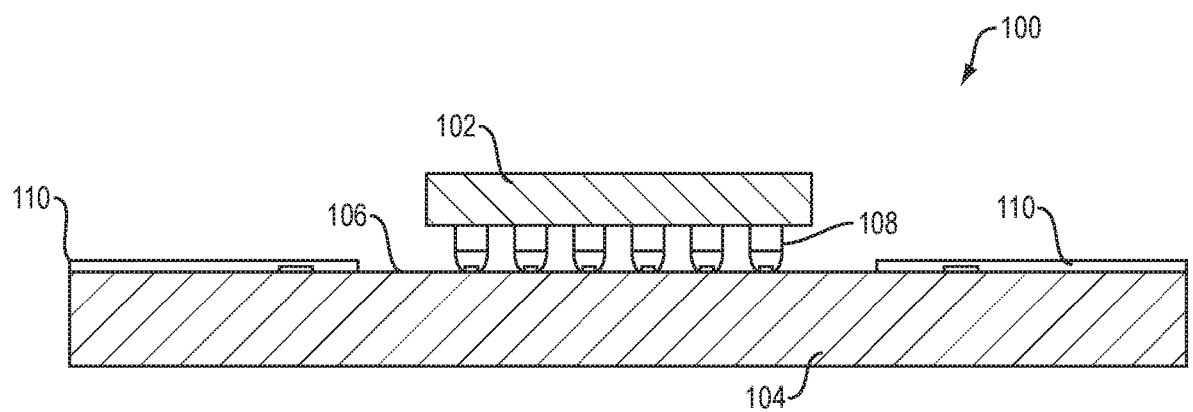
FIG. 1A is a diagram of a portion of a conventional flip-chip package having a die positioned on a substrate.
Figure 1B:
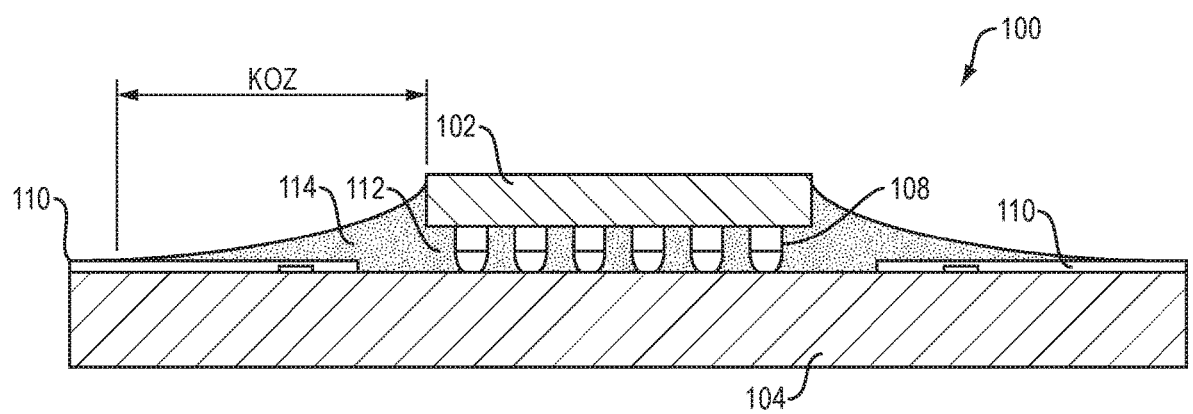
FIG. 1B is a diagram of the portion of the flip-chip package of FIG. 1A after an underfill material has been applied between the die and the substrate.

FIGS. 1A and 1B are diagrams illustrating a portion of a conventional flip-chip package 100. Flip-chip package 100 includes, for example, an IC die 102 (e.g., a flip-chip die) that is positioned on a surface 106 of substrate 104. Substrate 104 may be a circuit board (e.g., PCB) having external circuitry to which IC die 102 is electrically connected, for example, via one or more solder joints 108. Substrate 104 may further include a solder mask 110 on surface 106 that is configured to electrically connect to one or more additional components, for example, one or more NAND dies or other memory chips.

As illustrated in FIG. 1B, an underfill material 112 can be applied to further adhere IC die 102 to substrate 104. Underfill material 112 may be an electrically insulating material that is configured to fill the space between IC die 102 and substrate 104. Underfill material 112, for example, may include a curable resin selected to distribute the thermal expansion mismatch between IC die 102 and substrate 104 in order to prevent or reduce stress concentration in solder joints 108. In order to apply underfill material 112, underfill material 112 may be injected or otherwise dispensed at one or more sides of IC die 102 in a liquid form such that underfill material 112 is able to flow around solder joints 108 and, ideally, completely fill the volume between IC die 102 and surface 106 of substrate 104. After underfill material 112 is applied, underfill material 112 may be cured or hardened (e.g., heat cured) in order to solidify underfill material 112.

Due to the flowable condition of underfill material 112 when it is applied, a portion of underfill material 112 can extend beyond the edges of IC die 102 as illustrated in FIG. 1B. In some situations, an excess amount of underfill material 112 is applied in order to ensure that the space between IC die 102 and substrate 104 is completely underfilled. In some situations, capillary effects cause a portion of underfill material 112 to be drawn out away from IC die 102 along surface 106 of substrate 104. In some situations, underfill material 112 may also be pulled up along the sides of IC die 102. As a result, underfill material 112 may form a meniscus at the sides of IC die 102 with the underfill material 112 tapering away from IC die 102.

When hardened or cured, the portion of underfill material 112 that extends beyond the edges of IC die 102 creates a fillet 114 that at least partially surrounds IC die 102. In some situations, fillet 114 extends over solder mask 110 and can prevent other components from being connected adjacent to IC die 102. Since other dies or components (e.g., NAND dies) cannot be placed on or over fillet 114, the area occupied by fillet 114 is considered wasted area on substrate 104 and may be referred to as the "keep-out-zone" or KOZ. The further away from IC die 102 that fillet 114 extends, the greater the area of the KOZ. In some cases, for example, fillet 114 may extend a distance of about 1000 μm or more away from IC die 102.

The present invention, according to some embodiments, provides a flip-chip package having a reduced KOZ area when compared to a conventional flip-chip package. In some embodiments, as discussed, having a reduced KOZ area provides a greater area on the substrate that is available for the placement of other components (e.g., NAND dies, other Flash memory chips, or other integrated circuits) such that more components can be connected to a given substrate. In some embodiments, having a reduced KOZ area allows for other components to be positioned on the substrate closer to the IC die, which in turn allows for smaller overall package dimensions.

Figure 2A:
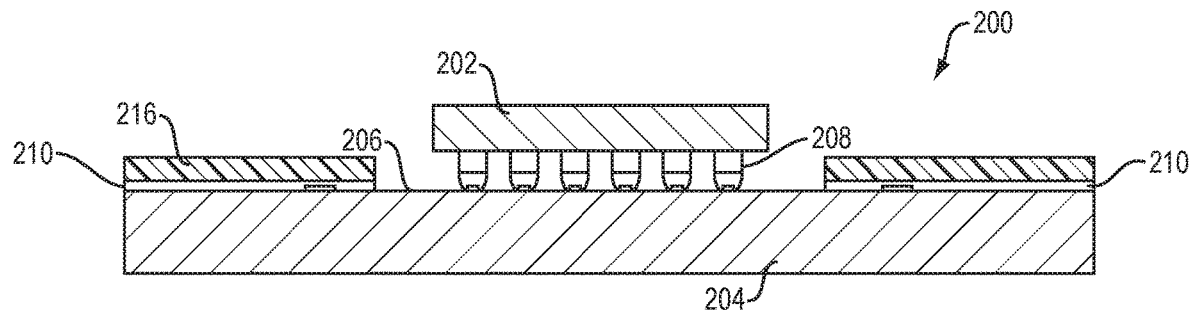
FIGS. 2A-2D are diagrams showing steps for packaging a flip-chip die in accordance with certain embodiments of the present invention to produce a flip-chip package having a reduced keep-out-zone (KOZ)
Figure 2B:
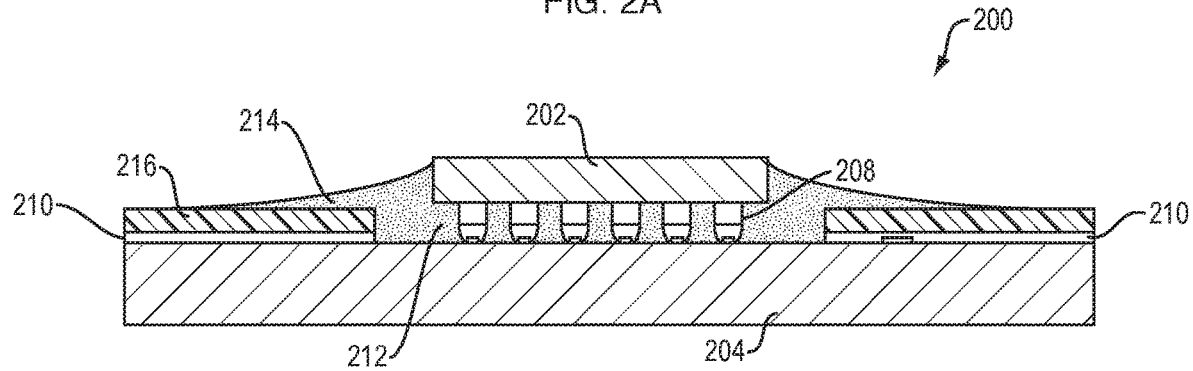

FIGS. 2A-2D illustrate various steps for producing a flip-chip package 200 having a reduced KOZ area in accordance with certain embodiments of the present invention. With particular reference to FIG. 2A, flip-chip package 200 includes, for example, an IC die 202 (e.g., a flip-chip die) that is positioned on a surface 206 of substrate 204. Substrate 204 may be a circuit board (e.g., PCB) having external circuitry to which IC die 202 is electrically connected. For example, IC die 202 may include contacts that are configured to make electrical contact with the substrate via, e.g., one or more solder joints 208. Substrate 204 may further include a solder mask 210 on surface 206 that is configured to electrically connect to one or more additional components, for example, one or more NAND dies or other memory chips. In these aspects, flip-chip package 200 may be similarly configured as conventional flip-chip package 100 of FIG. 1A according to some embodiments.

With further reference to FIG. 2A, a release film 216 can be overlaid over at least a portion of substrate 204. In some embodiments, release film 216 is overlaid over at least a portion of surface 206 of substrate 204. In some embodiments, release film 216 is overlaid over solder mask 210. In some embodiments, release film 216 is sized and positioned on substrate 204 to surround IC die 202. Release film 216, in some embodiments, is a polymer film, sheet, or coating that is removably applied over substrate 204 such that release film 216 can be subsequently removed from substrate 204 as will be described further. In some embodiments, the release film is an organic or inorganic tape, such as mask tape (Acrylic) or thermal release (TR) film with thickness of 5-100 um. In some embodiments, the size of film may be based on the size of the flip chip die, where the film is equal to or larger than the size of the flip chip die size. In some embodiments, the release film may be taped on the substrate using a taping machine.

As illustrated in FIG. 2A, an underfill material 212 can be applied to further adhere IC die 202 to substrate 204. As with the previously described underfill material 112, underfill material 212 may be an electrically insulating material that is configured to fill the space between IC die 202 and substrate 204. Underfill material 212, for example, may include a curable resin selected to distribute the thermal expansion mismatch between IC die 202 and substrate 204 in order to prevent or reduce stress concentration in solder joints 208. In order to apply underfill material 212, underfill material 212 may be injected or otherwise dispensed at one or more sides of IC die 202 in a liquid form such that underfill material 212 is able to flow around solder joints 208 and, ideally, completely fill the volume between IC die 202 and surface 206 of substrate 204. After underfill material 212 is applied, underfill material 212 may be cured or hardened (e.g., heat cured) in order to solidify underfill material 212. As further shown in FIG. 2B, a portion of underfill material 212 that extends beyond the edges of IC die 202 creates a fillet 214 that at least partially surrounds IC die 202. In some such embodiments, at least a portion of fillet 214 extends over solder mask 210. In some embodiments, fillet 214 extends over at least a portion of release film 216 as illustrated. In some embodiments, the portion of fillet 214 that extends over release film 216 is adhered to release film 216.

Figure 2C:
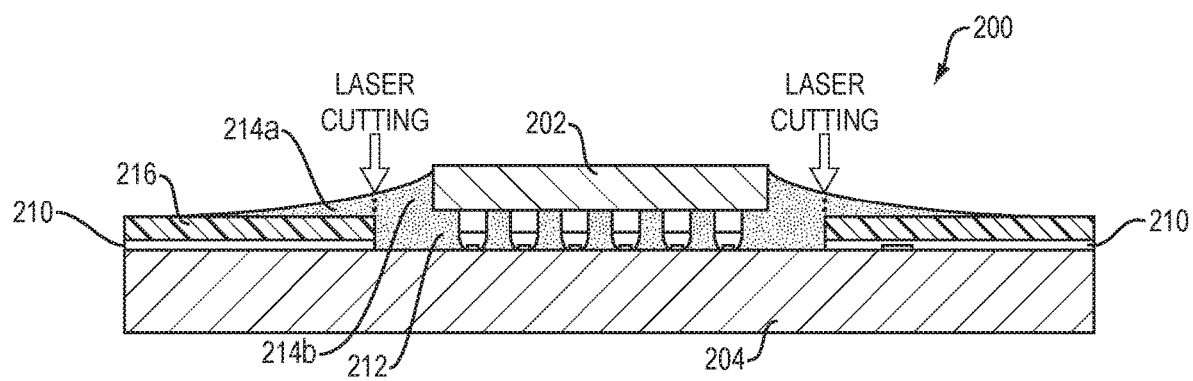

In some embodiments, a process for manufacturing a flip-chip package in accordance with the present invention includes truncating fillet 214. In some embodiments, truncating fillet 214 allows for a portion of fillet 214 to be removed in order to reduce the area occupied by fillet 214. As illustrated in FIG. 2C, in some embodiments fillet 214 is truncated by cutting fillet 214, for example, by mechanical cutting or, more preferably, by laser cutting. In some embodiments, fillet 214 is cut at a predetermined location and/or depth. In some embodiments, fillet 214 is cut at or proximate to an edge of solder mask 210. In some embodiments, fillet 214 is cut at or proximate to an edge of release film 216. In some embodiments, fillet 214 is cut at or proximate to an edge of IC die 202. In some embodiments, fillet 214 is cut at a location between solder mask 210 and IC die 202. In some embodiments, cutting fillet 214 does not include cutting into substrate 204 and/or solder mask 210. In some embodiments, fillet 214 may be cut such that fillet 214 is partitioned into at least a first portion 214a and a second portion 214b, which are separated by the cut. In some embodiments, first portion 214a may be located further away from IC die 202 than second portion 214b. In some embodiments, second portion 214b includes a portion of fillet 214 that is immediately adjacent to IC die 202. In some embodiments, first portion 214a may be partially or entirely positioned on release film 216. In some embodiments, first portion 214a may have a greater area (footprint) over substrate 204 than second portion 214b.

Following the cutting step, first portion 214a of fillet 214 is removed according to some embodiments. In some such embodiments, where first portion 214a is positioned on release film 216, first portion 214a is removed by removing release film 216 from substrate 204. First portion 214a of fillet 214, in some embodiments, is adhered to release film 216 such that first portion 214a of fillet 214 can be removed together with release film 216. Release film 216 may be peeled away from substrate 204 and/or solder mask 210, for example.

Figure 2D:
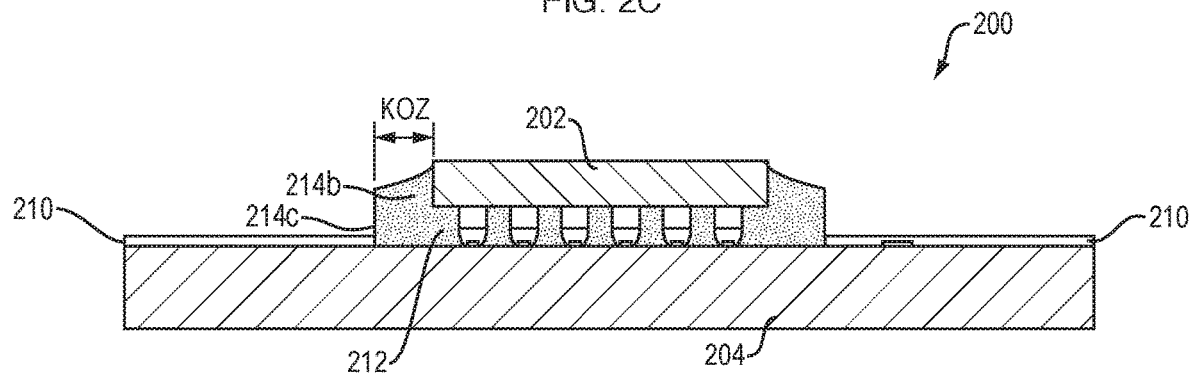

FIG. 2D illustrates flip-chip package 200 after first portion 214a and release film 216 have been removed according to certain embodiments. In some embodiments, second portion 214b of fillet 214 may remain on substrate 204 after release film 216 and first portion 214a are removed. In some embodiments, second portion 214b includes a truncated surface 214c where fillet 214 was cut. In some embodiments, at least a portion of truncated surface 214c of second portion 214b remains exposed after first portion 214a is removed. The truncated surface 214c, in some embodiments, may be planar or substantially planar, and may be perpendicular to surface 206 of substrate 204. In other embodiments, the truncated surface 214c may be obliquely angled (slanted) with respect to surface 206 of substrate 204, for example, if fillet 214 was cut at an oblique angle. As shown in the illustrated embodiment, removal of the portion of fillet 214 that covered solder mask 210 (e.g., first portion 214a) results in a significantly smaller underfill area and a reduced KOZ. In some embodiments, removal of first portion 214a of fillet 214 results in a reduction in the underfill area by at least 10%, at least 20%, at least 30%, at least 40%, at least 50%, at least 60%, at least 70%, at least 80%, or at least 90%. In some embodiments, removal of first portion 214a of fillet 214 results in a reduction in the underfill area by about 10% to about 20%, by about 15% to about 25%, by about 20% to about 30%, by about 25% to about 35%, by about 30% to about 40%, by about 35% to about 45%, by about 40% to about 50%, by about 45% to about 55%, by about 50% to about 60%, by about 55% to about 65%, by about 60% to about 70%, by about 65% to about 75%, by about 70% to about 80%, by about 75% to about 85%, or by about 80% to about 90%.

Figure 3A:
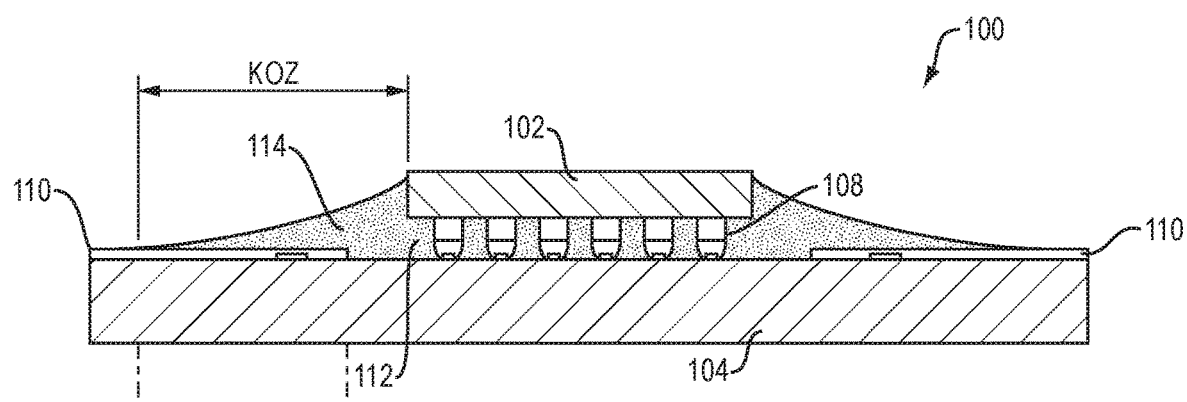
FIGS. 3A and 3B are diagrams comparing the KOZ distances between a conventional flip-chip package (FIG. 3A) and a flip-chip package in accordance with an embodiment of the present invention having a reduced underfill area (FIG. 3B)
Figure 3B:
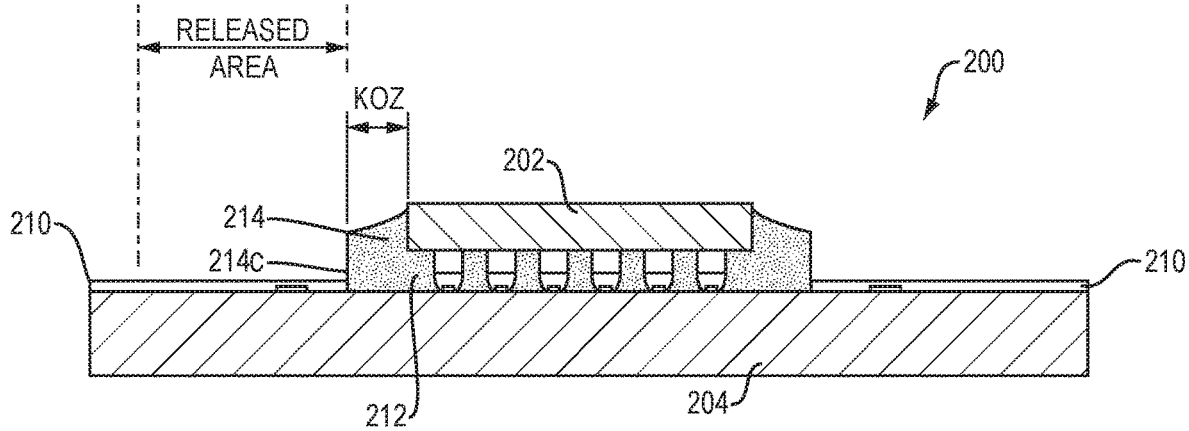

FIGS. 3A and 3B provide illustrations comparing the KOZ distances between a conventional flip-chip package 100 (FIG. 3A) and flip-chip package 200 having a reduced underfill area in accordance with an embodiment of the present invention (FIG. 3B). In flip-chip package 100, the entirety of fillet 114 of underfill material 112 remains on substrate 104 and overlays a portion of solder mask 110. The KOZ distance for flip-chip package 100 is the distance that fillet 114 extends away from IC die 102 and can be, for example, about 1000 μm or more in some cases. Flip-chip package 200, in contrast, includes a truncated fillet 214 (e.g., second portion 214b) such that the KOZ distance of flip-chip package 200 is significantly less than the KOZ distance of flip-chip package 100. The KOZ distance of flip-chip package 200 may be considered the distance between truncated surface 214c and IC die 202. In some embodiments, the KOZ distance for flip-chip package 200 may be, for example, less than 1000 µm, less than 900 µm, less than 800 µm, less than 700 µm, less than 600 µm, less than 500 µm, less than 400 µm, less than 300 µm, less than 200 µm, or less than 100 µm. The released area depicted in FIG. 3B denotes the area on substrate 204 that was formerly occupied by the removed first portion 214a of fillet 214 (FIG. 2C). In some embodiments, the released area represents the portion of substrate 204 that has been recovered by truncating fillet 214 and now made available for the placement of additional components (e.g., NAND dies or other chips). In the illustrated example, the release area has a dimension equal to the difference between the KOZ distances of flip-chip package 100 and flip-chip package 200. In some embodiments, truncated fillet 214 results in a reduction in the KOZ distance by at least 10%, at least 20%, at least 30%, at least 40%, at least 50%, at least 60%, at least 70%, at least 80%, or at least 90%. In some embodiments, truncated fillet 214 results in a reduction in the KOZ distance by about 10% to about 20%, by about 15% to about 25%, by about 20% to about 30%, by about 25% to about 35%, by about 30% to about 40%, by about 35% to about 45%, by about 40% to about 50%, by about 45% to about 55%, by about 50% to about 60%, by about 55% to about 65%, by about 60% to about 70%, by about 65% to about 75%, by about 70% to about 80%, by about 75% to about 85%, or by about 80% to about 90%.

FIGS. 4A and 4B provide illustrations comparing the relative placement of additional components 118, 218 (e.g., NAND dies) on conventional flip-chip package 100 (FIG. 4A) and flip-chip package 200 having a reduced underfill area in accordance with an embodiment of the present invention (FIG. 4B). In flip-chip package 100, as discussed above, the entirety of fillet 114 of underfill material 112 remains on substrate 104 and overlays a portion of solder mask 110. Additional component 118 must therefore be sufficiently distanced away from IC die 102 such that additional component 118 can be positioned on solder mask 110 without overlaying fillet 114. In contrast, the truncated fillet 214 of flip-chip package 200 allows for additional component 218 to be positioned in closer proximity to IC die 202, according to certain embodiments, because the portion of fillet 214 overlaying solder mask 210 has been removed. In some embodiments, additional component 218 is positioned proximate to or adjacent to the truncated surface 214c of fillet 214. Consequently, flip-chip package 200 permits closer positioning of additional components 218, which can reduce overall package dimensions and/or allow for more additional components 218 to be disposed on the surface of the substrate or solder mask, as the case may be. In some embodiments, additional component 218 can be positioned less than 1000 µm, less than 900 µm, less than 800 µm, less than 700 µm, less than 600 µm, less than 500 µm, less than 400 µm, less than 300 µm, less than 200 µm, or less than 100 µm from IC die 202.

Figure 5:
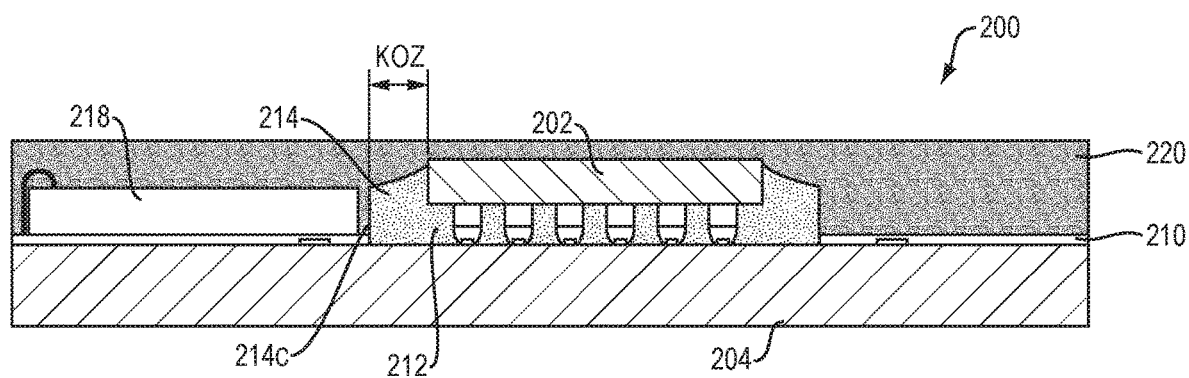
FIG. 5 is a diagram showing encapsulation of the components of FIG. 4B.

Turning to FIG. 5, in some embodiments, the components of the flip-chip package 200 may be encapsulated. For example, the IC die 202, additional component 218 and/or the fillet 214 may be encapsulated by a molding compound 220. In some embodiments, molding compound 220 may fill a space or gap between truncated surface 214c of fillet 214 and additional component 218.

It should be understood that various changes, substitutions, and alterations can be made herein without departing from the spirit and scope of the invention as defined by the appended claims. It should also be apparent that individual elements identified herein as belonging to a particular embodiment may be included in other embodiments of the invention. Moreover, the scope of the present application is not intended to be limited to the particular embodiments of the process, machine, manufacture, and composition of matter, means, methods and steps described in the specification. The scope of the invention also is not meant to be limited by the title or the Abstract, as these parts of the application are provided to facilitate searching specific features disclosed herein. As one of ordinary skill in the art will readily appreciate from the disclosure, processes, machines, manufacture, composition of matter, means, methods, or steps, presently existing or later to be developed, that perform substantially the same function or achieve substantially the same result as the corresponding embodiments described herein may be used according to the present invention.

What is claimed is:

1. An integrated circuit die package, comprising:
a substrate including a solder mask, the solder mask including a planar surface substantially parallel to the substrate and terminating at an edge of the solder mask;
an integrated circuit die positioned on a surface of the substrate, the integrated circuit die comprising contacts configured to make electrical contact with the substrate;
a molding compound encapsulating the integrated circuit die;
a monolithic underfill material at least partially disposed between the integrated circuit die and the surface of the substrate, with a portion of the underfill material extending beyond an edge of the integrated circuit die forming a fillet at least partially surrounding the integrated circuit die, wherein the fillet includes a truncated surface in direct contact with the molding compound; and
a second integrated circuit die positioned on the solder mask,
wherein the truncated surface of the monolithic underfill material is in direct contact with the edge of the solder mask.

2. The integrated circuit die package of claim 1, wherein the truncated surface is substantially perpendicular to the surface of the substrate.

3. The integrated circuit die package of claim 1, wherein the second integrated circuit die comprises at least one NAND die positioned on the solder mask.

4. The integrated circuit die package of claim 3, wherein the at least one NAND die is positioned proximate to or adjacent to the truncated surface of the fillet.

5. The integrated circuit die package of claim 4, wherein the at least one NAND die is positioned less than 1000 µm from the integrated circuit die.

6. The integrated circuit die package of claim 1, wherein an area of the substrate occupied by the monolithic underfill material does not comprise the solder mask.

7. An integrated circuit die package, comprising:
a means for providing electrical interconnections including a solder mask on the means for providing electrical interconnections, the solder mask including a planar surface substantially parallel to the means for providing electrical interconnections and terminating at an edge of the solder mask;
an integrated circuit die attached to the means for providing electrical interconnections, wherein the integrated circuit die includes means for electrically connecting the integrated circuit die with the means for providing electrical interconnections;

a means for encapsulating the integrated circuit die;

a monolithic underfill material disposed between the integrated circuit die and the means for providing electrical interconnections, wherein a portion of the underfill material extends beyond an edge of the integrated circuit die, thereby forming a fillet that at least partially surrounds the integrated circuit die, wherein the fillet includes a truncated surface in direct contact with the means for encapsulating the integrated circuit die; and a second integrated circuit die positioned on the solder mask, wherein the truncated surface of the monolithic underfill material is in direct contact with the edge of the solder mask.

8. The integrated circuit die package of claim 7, wherein the second integrated circuit die comprises at least one memory die attached to the means for providing electrical interconnections adjacent to the truncated surface and electrically connected to the means for providing electrical interconnections, wherein the means for providing electrical interconnections connects the at least one memory die with the integrated circuit die, and wherein the means for encapsulating the integrated circuit die covers the at least one memory die, the integrated circuit die, and the fillet.

9. The integrated circuit die package of claim 7, wherein an area of the means for providing electrical interconnections occupied by the monolithic underfill material does not comprise the solder mask.

* * * * *